(12) United States Patent
Noda (10) Patent No.: US 7,630,247 B2
(45) Date of Patent: Dec. 8, 2009

(54) MIS-TRANSISTOR-BASED NONVOLATILE MEMORY

(75) Inventor: Kenji Noda, Fukuoka (JP)

(73) Assignee: Nscore Inc., Fukuoka (JP)

( * ) Notice: Subject to any disclaimer, the term of this patent is extended or adjusted under 35 U.S.C. 154(b) by 152 days.

(21) Appl. No.: 12/036,938

(22) Filed: Feb. 25, 2008

(65) Prior Publication Data

US 2009/0213650 A1    Aug. 27, 2009

(51) Int. Cl.
    *G11C 16/04* (2006.01)

(52) U.S. Cl. .............................. 365/185.18; 365/185.08; 365/185.21

(58) Field of Classification Search ............ 365/185.08, 365/185.18, 185.21
    See application file for complete search history.

(56) References Cited

U.S. PATENT DOCUMENTS

| | | | |
|---|---|---|---|
| 3,636,530 A | 1/1972 | Mark et al. .................. | 365/228 |
| 4,419,744 A | 12/1983 | Rutter ......................... | 365/154 |
| 5,956,269 A | 9/1999 | Ouyang et al. ......... | 365/185.08 |
| 6,038,168 A | 3/2000 | Allen et al. ............ | 365/185.07 |
| 6,064,590 A | 5/2000 | Han et al. | |
| 6,740,927 B1 | 5/2004 | Jeng | |
| 6,906,953 B2 | 6/2005 | Forbes ................... | 365/185.03 |
| 6,906,962 B2 | 6/2005 | Layman et al. ............. | 365/190 |
| 6,909,635 B2 | 6/2005 | Forbes et al. ........... | 365/185.18 |
| 7,227,234 B2 | 6/2007 | Roizin et al. | |
| 2004/0232477 A1 | 11/2004 | Iwata et al. | |
| 2004/0252254 A1 | 12/2004 | Koo et al. | |
| 2009/0016105 A1* | 1/2009 | Noda et al. ............. | 365/185.05 |
| 2009/0052229 A1* | 2/2009 | Kikuchi ...................... | 365/154 |

FOREIGN PATENT DOCUMENTS

| | | |
|---|---|---|
| JP | 6-76582 | 3/1994 |
| JP | 6-231587 | 8/1994 |
| JP | 2001-156188 | 6/2001 |
| JP | 2002-237540 A | 8/2002 |
| WO | 2004/057621 A1 | 7/2004 |
| WO | 2006/093629 A1 | 9/2006 |

* cited by examiner

*Primary Examiner*—Hoai V Ho
(74) *Attorney, Agent, or Firm*—Ladas & Parry LLP (57) ABSTRACT

A nonvolatile semiconductor memory device includes a latch circuit including a first inverter and a second inverter cross-coupled to each other, a source node of a MIS transistor of the first inverter and a source node of a MIS transistor of the second inverter being both coupled to a plate line, and a control circuit configured to apply a first potential to the plate line in a store mode to cause a change in threshold voltage to one of the MIS transistors, and configured to apply a second potential to the plate line in a power-on mode to cause the latch circuit to latch data responsive to the change in threshold voltage generated in the store mode, such that the data latched by the latch circuit in the power-on mode is automatically output to outside the nonvolatile semiconductor memory device upon power-on thereof.

9 Claims, 7 Drawing Sheets

MIS-TRANSISTOR-BASED NONVOLATILE MEMORY

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices include flash EEPROMs employing a floating gate structure, FeRAMs employing a ferroelectric film, MRAMs employing a ferromagnetic film, etc. In the case of EEPROMs, there is a need to manufacture a transistor having a special structure comprised of a floating gate. In the case of FeRAMs and MRAMs, there is a need to form a film made of a ferroelectric material and a ferromagnetic material, respectively. The need for the transistor having a special structure and the need for the film made of a special material are one of the factors that result in an increase in the manufacturing costs.

PCT/JP2003/016143, which was filed on Dec. 17, 2003, the entire contents of which are hereby incorporated by reference, discloses a nonvolatile memory cell comprised of a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience an irreversible hot-carrier effect on purpose for storage of one-bit data. A difference in the transistor characteristics caused by the hot-carrier effect represents one-bit data "0" or "1".

Japanese Patent Application Publication No. 6-76582 also discloses a nonvolatile memory cell using MIS (metal-insulating film-semiconductor) transistors. This memory cell is a latch circuit comprised of two inverters cross-coupled to each other. Two transistors having the same conduction type among the transistors constituting the latch circuit are subjected to a hot-carrier effect on purpose so as to create an imbalance in their threshold voltages. Such imbalance represents one bit data stored in the memory cell.

Generally, there is no known nonvolatile memory device that can automatically output the retained data upon the power-on. Any nonvolatile memory device known to the date that store data as a change in the electrical characteristics of a memory cell requires a read command applied thereto from an external device after the device is powered on. This is because there is a need to create a balanced state initially and to tip the balance in response to the electrical characteristics of the memory cell in order to read data from the memory cell. The above-described memory device disclosed in Japanese Patent Application Publication No. 6-76582 is no exception, and requires a read command applied thereto after the power-on.

For use in a simple system such as a small amplifier, a nonvolatile memory device is preferably provided with the function to output the retained data automatically upon the power on.

SUMMARY OF THE INVENTION

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

According to at least one embodiment of the present invention, a nonvolatile semiconductor memory device includes a plate line, a latch circuit including a first inverter and a second inverter cross-coupled to each other, the first inverter including a first MIS transistor of a first conduction type and a second MIS transistor of a second conduction type connected in series, the second inverter including a third MIS transistor of the first conduction type and a fourth MIS transistor of the second conduction type connected in series, a source node of the second MIS transistor and a source node of the fourth MIS transistor being both coupled to the plate line, and a control circuit configured to apply a first potential to the plate line in a store mode to cause a change in threshold voltage to one of the second MIS transistor and the fourth MIS transistor, whichever is selected in response to data latched in the latch circuit, and configured to apply a second potential to the plate line in a power-on mode to cause the latch circuit to latch data responsive to the change in threshold voltage generated in the store mode, such that the data latched by the latch circuit in the power-on mode is automatically output from an output terminal to outside the nonvolatile semiconductor memory device upon power-on thereof.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

A memory cell used in at least one embodiment of the present invention stores one-bit data in a pair of MIS transistors that have the same structure as ordinary MIS transistors used for conventional transistor functions (e.g., switching function). These MIS transistors for nonvolatile data retention have neither a special structure such as a floating gate structure nor a special material such as a ferroelectric material or a ferromagnetic material. These MIS transistors are configured to experience a hot-carrier effect on purpose for storage of one-bit data.

The hot-carrier effect leaves an irreversible lingering change in the transistor characteristics. Changes in the characteristics of the MIS transistors caused by the hot-carrier effect achieve nonvolatile data retention. Which one of the MIS transistors has a stronger lingering change determines whether the stored data is "0" or "1".

Further, a latch circuit is used to determine data to be stored in these memory MIS transistors. The latch circuit is also used to recall (sense) the data stored in the memory MIS transistors. The pair of memory MIS transistors may be incorporated in and form part of the latch circuit.

Figure 1:
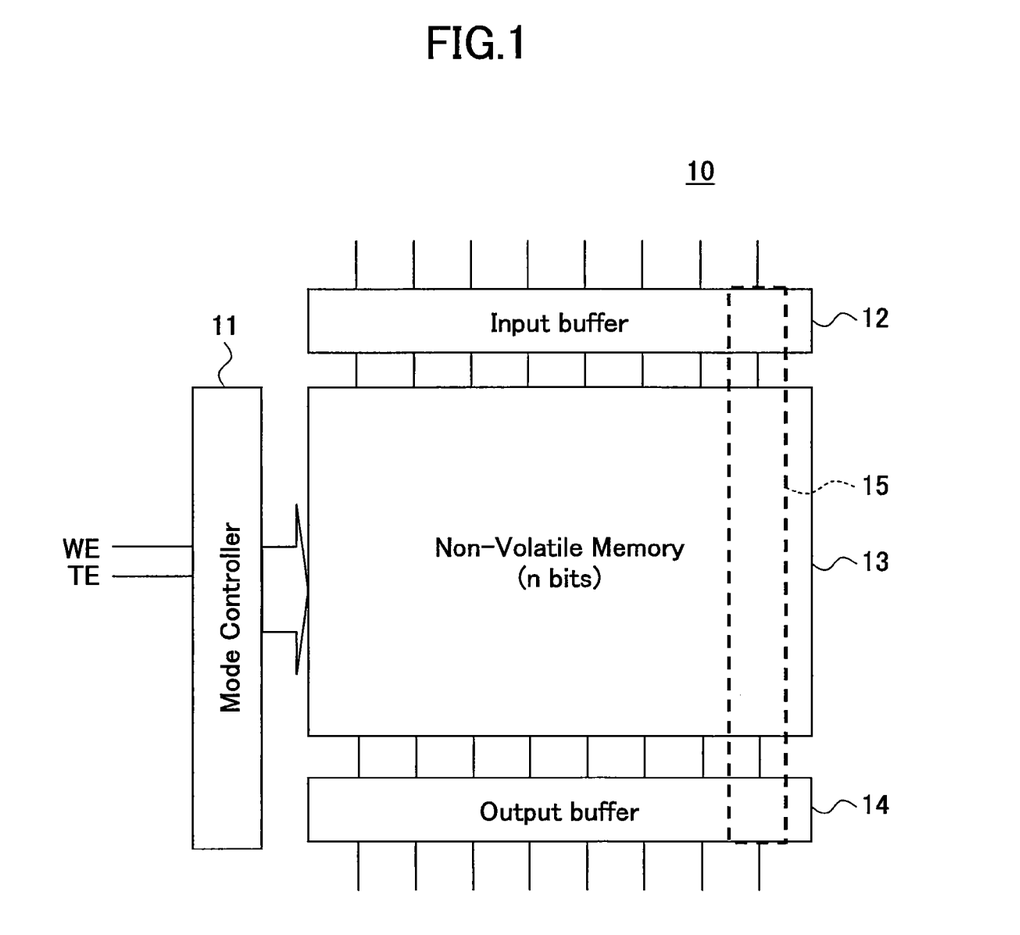
FIG. 1 is a block diagram showing a general configuration of a nonvolatile semiconductor memory device according to an embodiment of the present invention.

FIG. 1 is a block diagram showing a general configuration of a nonvolatile semiconductor memory device according to an embodiment of the present invention. A nonvolatile semiconductor memory device 10 shown in FIG. 1 includes a mode controller 11, an input buffer 12, a nonvolatile memory unit 13, and an output buffer 14.

The mode controller 11 receives a write-enable signal WE and a test-enable signal TE from an external device. The write-enable signal WE and the test-enable signal TE are set to a desired combination so as to specify one of a store mode, a test-write mode, and a power-on mode. In response to the write-enable signal WE and the test-enable signal TE, the mode controller 11 supplies various control signals to the nonvolatile memory unit 13, thereby causing the nonvolatile memory unit 13 to operate in a specified one of the three modes.

Data supplied to the nonvolatile semiconductor memory device 10 is input into the input buffer 12. The input data is then supplied from the input buffer 12 to the nonvolatile memory unit 13. The input data may be comprised of n bits (n: integer), and the nonvolatile memory unit 13 includes n memory cells for storage of the n bits of the input data. Under the control of the mode controller 11, the nonvolatile memory unit 13 may operate in the store mode to store the input data in these memory cells in a nonvolatile manner. Under the control of the mode controller 11, the nonvolatile memory unit 13 may operate in the test-write mode to write the input data to these memory cells in a volatile manner for the purpose of checking the latch function of each memory cell.

An input buffer portion for one bit, a memory cell for storage of one bit, and an output buffer portion for one bit are combined to form a memory cell unit 15. A total of n such memory cell units 15 are provided in the nonvolatile semiconductor memory device 10.

Data output from the nonvolatile memory unit 13 is comprised of n bits, and is supplied to the output buffer 14. The output buffer 14 outputs the output data from the external terminals of the nonvolatile semiconductor memory device 10.

The nonvolatile semiconductor memory device 10 is provided with no decoding function to specify an address for data storage. Without any address decoding function, input data is comprised of n bits, and the nonvolatile semiconductor memory device 10 only stores one set of these n bits. Since the nonvolatile semiconductor memory device 10 is intended for use in a simple system in which the stored data is supposed to be output automatically upon the power-on, the provision of an address decoding function may run counter to the intended purpose.

Figure 2:
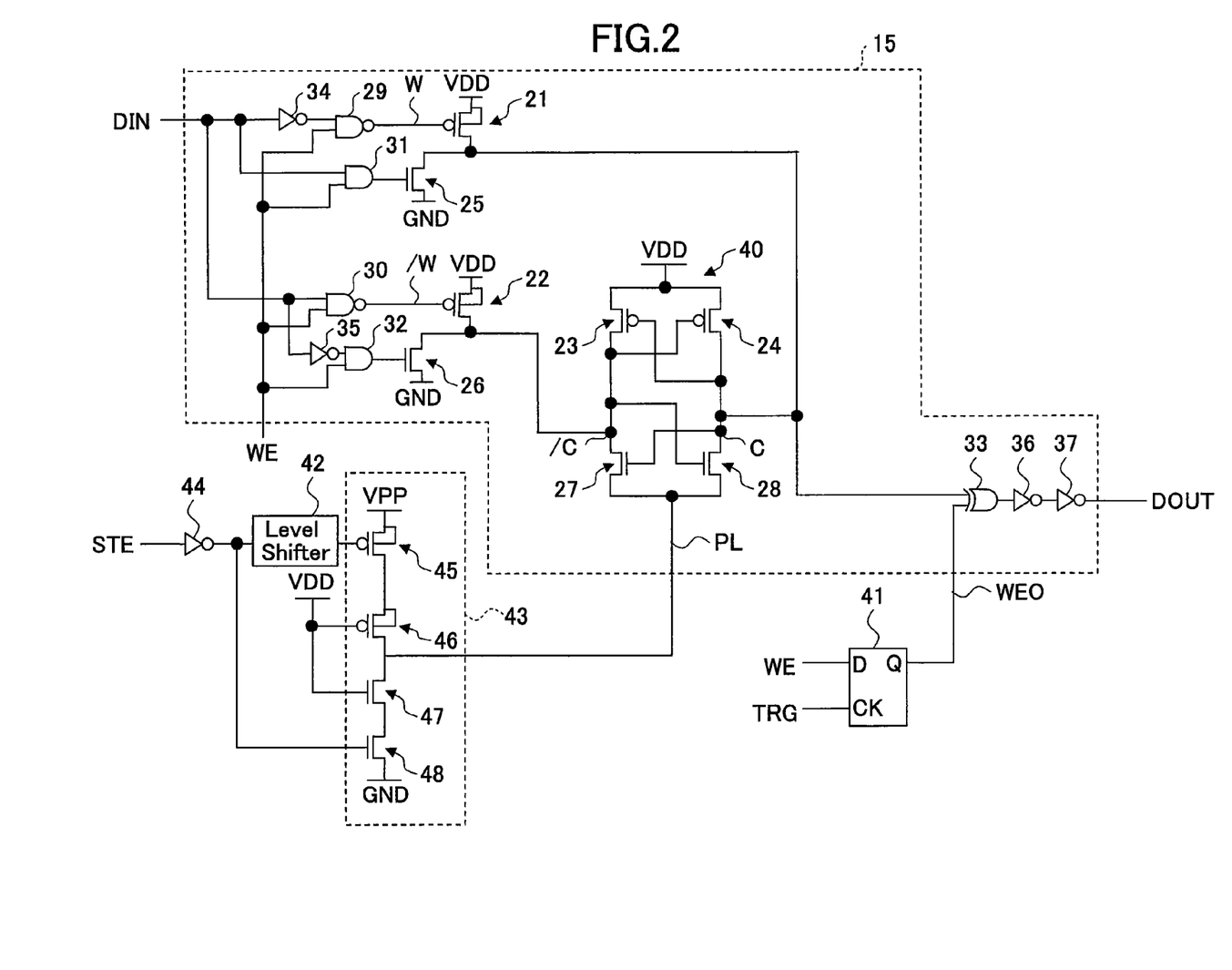
FIG. 2 is a circuit diagram showing an example of the configuration of a memory cell unit shown in FIG. 1 together with peripheral circuits that are part of a mode controller.

FIG. 2 is a circuit diagram showing an example of the configuration of the memory cell unit 15 together with peripheral circuits that are part of the mode controller 11. The memory cell unit 15 includes PMOS transistors 21 through 24, NMOS transistors 25 through 28, NAND gates 29 and 30, AND gates 31 and 32, an EXOR gate 33, and inverters 34 through 37. The inverters 34 and 35, NAND gates 29 and 30, AND gates 31 and 32, PMOS transistors 21 and 22, and NMOS transistors 25 and 26 may together constitute a one-bit input buffer portion that is part of the input buffer 12 shown in FIG. 1. The inverters 36 and 37 may together constitute a one-bit output buffer portion that is part of the output buffer 14 shown in FIG. 1.

The PMOS transistors 23 and 24 and the NMOS transistors 27 and 28 together constitute a memory cell for storage of one bit. The PMOS transistor 23 and NMOS transistor 27 constitute a first inverter, and the PMOS transistor 24 and NMOS transistor 28 constitute a second inverter. The first inverter and the second inverter are cross-coupled to each other to form a latch circuit 40. When the write-enable signal WE is set to HIGH, and input data DIN is "1", the latch circuit 40 comprised of the cross-coupled inverters latches the input data such that nodes C and /C are set to LOW and HIGH, respectively. When the input data DIN is "0", on the other hand, the latch circuit 40 comprised of the cross-coupled inverters latches the input data such that nodes C and /C are set to HIGH and LOW, respectively.

The data latched in the latch circuit 40 as described above is volatile data that will be lost when the device is powered off. In order to achieve nonvolatile data retention, this latched data is used to cause a change in the threshold voltages of nonvolatile memory cell transistors. In the example shown in FIG. 2, the NMOS transistors 27 and 28 serve as nonvolatile memory cell transistors that are subjected to a hot-carrier effect. Alternatively, provision may be made such that the PMOS transistors 23 and 24 serve as nonvolatile memory cell transistors.

A plate line PL that is coupled to the memory cell extends from a plate line drive circuit 43. The plate line drive circuit 43 is coupled to a level shifter 42. The level shifter 42, the plate line drive circuit 43, and an inverter 44 are part of the mode controller 11 shown in FIG. 1. When the write-enable signal WE and the test-enable signal TE are set to HIGH and LOW, respectively, to indicate the store mode, such mode setting causes a store-enable signal STE to be set to HIGH. In response to the HIGH state of the store-enable signal STE, the plate line drive circuit 43 sets the plate line PL to a high voltage VPP. This high voltage VPP may be set to 5.0 V when the transistors used in the memory cell unit 15 are made by a 0.18-μm process technology, and have a 1.8-V breakdown voltage, for example. In such case, a power supply voltage VDD may be set to 1.8 V.

The application of the high voltage VPP to the plate line PL serves to perform a store operation that converts the latched data of the latch circuit 40 into nonvolatile data. Such store operation is done by creating a hot-carrier-effect-based change in transistor characteristics with respect to either one of the paired NMOS transistors 27 and 28, whichever is selected by the data stored in the latch circuit 40. Either one of the NMOS transistor 27 and the NMOS transistor 28 whose source node is set at the LOW level will experience a hot-carrier effect while the other one does not experience a hot-carrier effect. The NMOS transistor having experienced this hot-carrier effect ends up having a larger threshold voltage than the NMOS transistor having experienced no hot-carrier effect.

Figure 3:
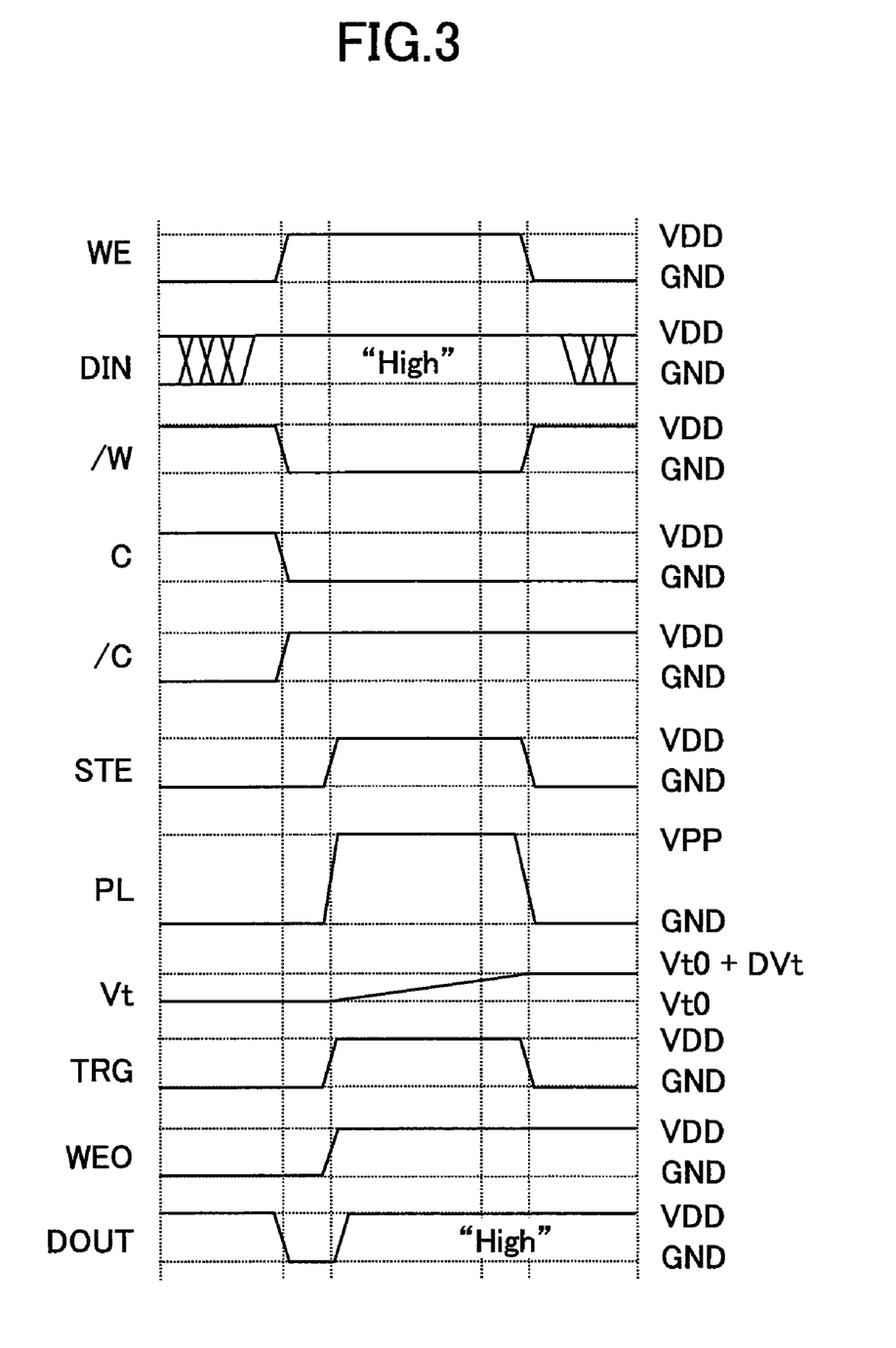
FIG. 3 is a drawing showing signal waveforms for explaining an example of a store operation.

FIG. 3 is a drawing showing signal waveforms for explaining an example of a store operation. In this example, the write-enable signal WE is set to HIGH while the input data DIN that is HIGH ("1") is applied to the nonvolatile semiconductor memory device 10. The test-enable signal TE (now shown) is kept at LOW.

In response to the HIGH state of the write-enable signal WE and the input data DIN that is "1", a signal /W applied to the PMOS transistor 22 (see FIG. 2) changes to LOW as shown in FIG. 3. It should be noted that a signal W applied to the PMOS transistor 21 (see FIG. 2) changes to HIGH in this case. As a result, the latch circuit 40 comprised of the cross-coupled inverters (i.e., PMOS transistors 23 and 24 and the NMOS transistors 27 and 28 shown in FIG. 2) stores the input data DIN, such that nodes C and /C are set to LOW and HIGH, respectively.

The store-enable signal STE thereafter changes to HIGH, causing the plate line PL to be set to HIGH. In response, a voltage of 5.0 V between the high voltage VPP and the LOW level (0 V) is applied between the source node and drain node of the NMOS transistor 28 while the gate node of the NMOS transistor 28 is set to 1.8 V appearing at the node /C. The gate node of the NMOS transistor 27, on the other hand, is set to 0 V appearing at the node C. Placed in these voltage settings, the NMOS transistor 28 experiences a hot-carrier effect while the NMOS transistor 27 does not. Because of the hot-carrier effect, a threshold voltage Vt of the NMOS transistor 28 increases from an initial threshold voltage Vt to Vt+ΔVt as shown in FIG. 3. The threshold voltage of the NMOS transistor 27 remains unchanged. As a result, the threshold voltage Vt of the NMOS transistor 28 becomes larger than that of the NMOS transistor 27.

Turning back to FIG. 2, the node C of the latch circuit 40 is coupled to the output node of the nonvolatile semiconductor memory device 10 via the EXOR gate 33 and the inverters 36 and 37. The EXOR gate 33 receives at one input node thereof the signal appearing at the node C, and receives at the other input node thereof a signal WEO from a D-latch 41, which is part of the mode controller 11. The D-latch 41 receives the write-enable signal WE at a data input node D, and receives a trigger signal TRG at a clock input node CK. The trigger signal TRG is asserted in response to the assertion of the write-enable signal WE.

This trigger signal TRG is shown in FIG. 3. In response to the HIGH state of the trigger signal TRG, the D-latch 41 latches HIGH data (i.e., latches the write-enable signal WE that is HIGH), so that the signal WEO is set to HIGH as shown in FIG. 3. The signal WEO is kept at HIGH even after the write-enable signal WE is negated (i.e., set to LOW).

With the signal WEO being HIGH, the EXOR gate 33 shown in FIG. 2 serves to invert the data appearing at the node C, so that output data DOUT is an inverse of the data appearing at the node C. Since the data appearing node C is an inverse of the input data DIN, the output data DOUT appearing at an output node of the nonvolatile semiconductor memory device 10 is the same as the input data DIN applied to the nonvolatile semiconductor memory device 10. In the example shown in FIG. 3, the input data DIN is HIGH, and the output data DOUT is also set to HIGH.

Figure 4:
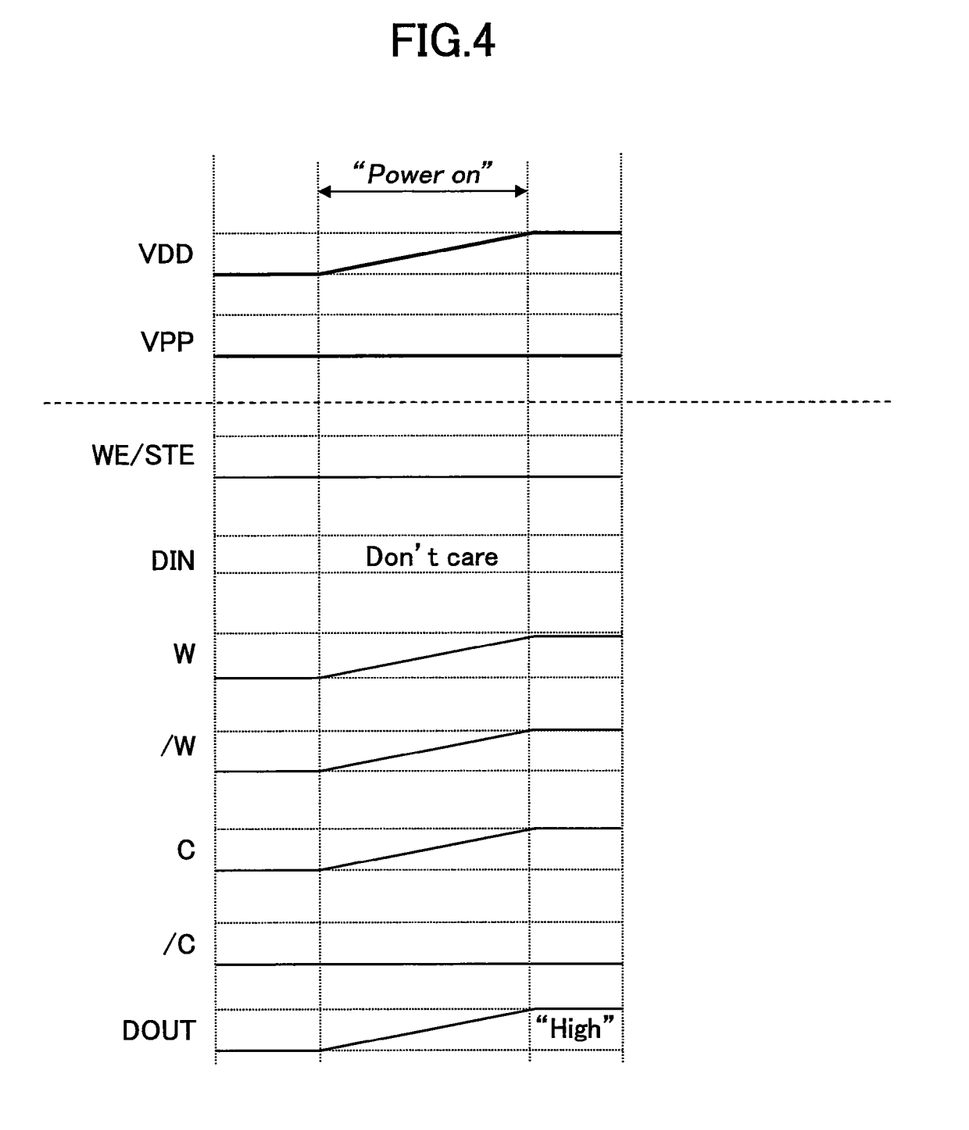
FIG. 4 is a drawing showing signal waveforms for explaining an example of a power-on operation.

FIG. 4 is a drawing showing signal waveforms for explaining an example of a power-on operation. When the nonvolatile semiconductor memory device 10 is powered on, the write-enable signal WE and the test-enable signal TE are externally set to LOW, which causes the mode controller 11 to specify the power-on mode.

In response to the power-on, the power supply voltage VDD used in the nonvolatile semiconductor memory device 10 (such as the memory cell unit 15 shown in FIG. 2) increases from 0 V to a predetermined voltage level (e.g., 1.8 V). An increase in the voltage VDD inside the nonvolatile semiconductor memory device 10 is gradual as shown in FIG. 4. Since the write-enable signal WE is set to LOW, the signal W applied to the gate of the PMOS transistor 21 (see FIG. 2) exhibits an increase that follows the increase of VDD as shown in FIG. 4. By the same token, the signal /W applied to the gate of the PMOS transistor 22 exhibits an increase that follows the increase of VDD as shown in FIG. 4. Consequently, the PMOS transistors 21 and 22 are kept nonconductive. Since the outputs of the AND gates 31 and 32 applied to the gates of the NMOS transistors 25 and 26 shown in FIG. 2 are LOW, the NMOS transistors 25 and 26 are also kept nonconductive. The input data DIN applied to the nonvolatile semiconductor memory device 10 during the power-on operation thus does not affect the signal states of the nodes C and /C. In other words, the nodes C and /C are electrically disconnected from the data input node.

In the power-on mode, the store-enable signal STE is kept at LOW as shown in FIG. 4. With the store-enable signal STE being LOW, the NMOS transistor 48 of the plate line drive circuit 43 shown in FIG. 2 becomes conductive, so that the plate line PL is kept at LOW (i.e., kept at the ground potential) during the power-on operation.

The latch circuit 40 shown in FIG. 2 is coupled to VDD and to the plate line PL that is kept at 0 V during the power-on operation. As the voltage VDD applied to the latch circuit 40 gradually increases from 0 V, an electric current starts flowing through the latch circuit 40, and gradually increases in response to the increase of VDD. As is well known, the latch circuit 40 is a bi-stable circuit in which the nodes C and /C are set to opposite logic levels (i.e., HIGH and LOW) in the stable state. When there is an imbalance in threshold voltages between the NMOS transistor 27 and the NMOS transistor 28, thus, the latch circuit 40 will reach a stable state in which the electric current flows only one of the NMOS transistors 27 and 28 that has a smaller threshold voltage.

In the example of a store operation shown in FIG. 3, the threshold voltage Vt of the NMOS transistor 28 is made larger than the threshold voltage of the NMOS transistor 27. The example of a power-on operation shown in FIG. 4 corresponds to the example of FIG. 3. Since threshold voltage of the NMOS transistor 28 is larger than the threshold voltage of the NMOS transistor 27, it is easier for an electric current to run through the NMOS transistor 27 than through the NMOS transistor 28. Consequently, as VDD gradually increases, an electric current runs in an increasing amount through the NMOS transistor 27 while little electric current runs through the NMOS transistor 28. The potential at the node C gradually increases, which serves to make the NMOS transistor 27 conductive. The potential at the node /C thus stays LOW, which serves to make the NMOS transistor 28 nonconductive. When VDD is set to the predetermined HIGH voltage, thus, the nodes C and /C are set to HIGH and LOW, respectively, as shown in FIG. 4. In this manner, the latch circuit 40 serves to sense the imbalance in the threshold voltages of the NMOS transistors 27 and 28 so as to latch (recall) the data responsive to such imbalance.

It should be noted that the node C is set to LOW in response to the input data "1" during the store operation whereas the node C is set to HIGH upon recalling this input data DIN "1" during the power-on operation. That is, the signal levels of the nodes C and /C are reversed between the store operation and the power-on operation. There is thus a need to provide a mechanism that inverts the output data at the time of power-on operation.

The D-latch 41 and the EXOR gate 33 serve as such mechanism that takes care of the problem of data inversion. During the store operation, the write-enable signal WE is set to HIGH, so that the signal WEO output from the D-latch 41 is set to HIGH. In response, the EXOR gate 33 serves as an inverter to invert the logic level of the node C. During the power-on operation, on the other hand, the write-enable signal WE is set to LOW, so that the signal WEO output from the D-latch 41 is set to LOW. In response, the EXOR gate 33 serves as a transfer gate that simply passes the logic level of the node C to its output node without any change. In the example shown in FIG. 4, thus, the node C is set to HIGH, and the output data DOUT is also set to HIGH (i.e., "1"). This output data DOUT that is "1" is consistent with the input data DIN that is "1".

In this manner, the nonvolatile semiconductor memory device 10 is configured to allow the recalled data to be output automatically upon the power-on. That is, data stored as a change in the threshold voltages of the nonvolatile memory cell transistors is automatically recalled (sensed) by the latch circuit 40 upon the power-on for output to outside the nonvolatile semiconductor memory device 10. Here, automatic recalling means that the stored data is output without a read command or the like applied to the nonvolatile semiconductor memory device 10 from an external device after the nonvolatile semiconductor memory device 10 is powered on.

Figure 5:
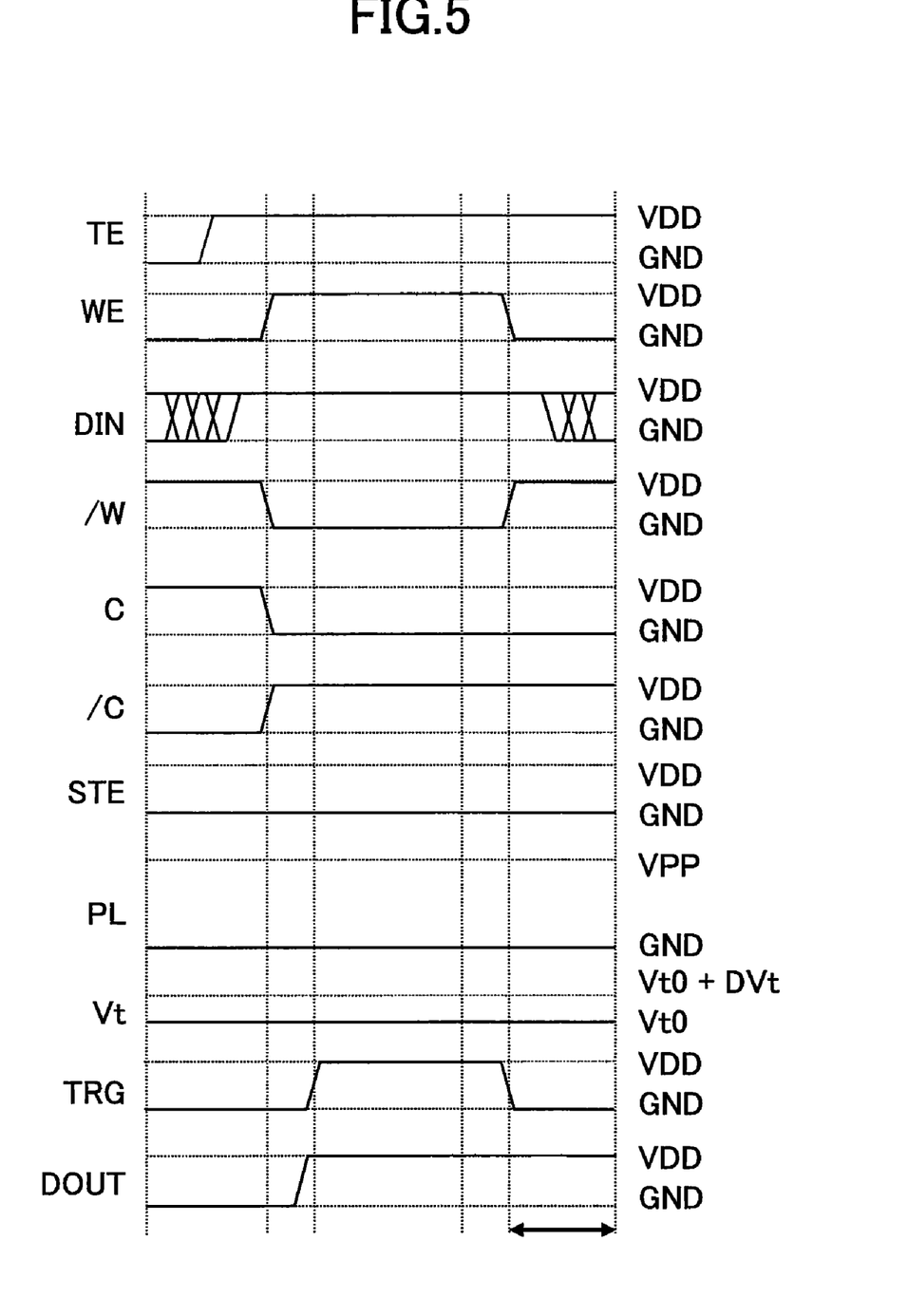
FIG. 5 is a drawing showing signal waveforms for explaining an example of a test-write operation.

FIG. 5 is a drawing showing signal waveforms for explaining an example of a test-write operation. In order to perform a test-write operation, the write-enable signal WE and the test-enable signal TE are both set to HIGH, so that the mode controller 11 specifies the write-enable mode.

In response to the HIGH state of the write-enable signal WE and the input data DIN that is "1", the signal /W applied to the PMOS transistor 22 (see FIG. 2) changes to LOW as shown in FIG. 5. It should be noted that the signal W applied to the PMOS transistor 21 (see FIG. 2) changes to HIGH in this case. As a result, the latch circuit 40 stores the input data DIN, such that nodes C and /C are set to LOW and HIGH, respectively.

In the test-write mode, the store-enable signal STE stays LOW, thereby causing the plate line PL to be set to LOW. With the plate line PL being LOW, the latch circuit 40 functions as a normal latch without creating any change to the threshold voltages of the NMOS transistors 27 and 28.

The trigger signal TRG shown in FIG. 5 is asserted in response to the assertion of the write-enable signal WE. In response to the HIGH state of the trigger signal TRG, the D-latch 41 shown in FIG. 2 latches HIGH data (i.e., latches the write-enable signal WE that is HIGH), so that the signal WEO is set to HIGH. The signal WEO is kept at HIGH even after the write-enable signal WE is negated (i.e., set to LOW). With the signal WEO being HIGH, the EXOR gate 33 shown in FIG. 2 serves to invert the data appearing at the node C, so that output data DOUT is an inverse of the data appearing at the node C. Since the data appearing node C is an inverse of the input data DIN, the output data DOUT appearing at the output node of the nonvolatile semiconductor memory device 10 is the same as the input data DIN applied to the nonvolatile semiconductor memory device 10. In the example shown in FIG. 3, the input data DIN is HIGH, and the output data DOUT is also set to HIGH.

The test-write operation as described above may be used to check whether the input buffer 12, the latch circuit 40, and the output buffer 14 operate in the manner in which they are supposed to operate, without any error or malfunction. During such test-write operation, each latch circuit 40 may or may not have a nonvolatile data bit stored therein. In other words, the presence/absence of nonvolatile data is irrelevant to the test-write operation.

Figure 6:
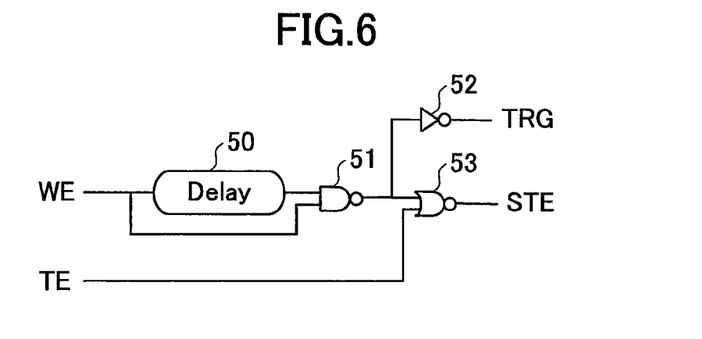
FIG. 6 is a drawing showing an example of the circuit that generates a trigger signal TRG and a store-enable signal STE.

FIG. 6 is a drawing showing an example of the circuit that generates the trigger signal TRG and the store-enable signal STE. This circuit is part of the mode controller 11 shown in FIG. 1. The circuit for generating the trigger signal TRG and the store-enable signal STE includes a delay circuit 50, a NAND gate 51, an inverter 52, and a NOR gate 53.

The NAND gate 51 receives at one input node thereof the write-enable signal WE, and receives at the other input node thereof a delayed write-enable signal WE that is made by delaying the write-enable signal WE through the delay circuit 50. The output of the NAND gate 51 is inverted by the inverter 52 for provision as the trigger signal TRG to the D-latch 41 shown in FIG. 2. The waveform of the trigger signal is shown in FIG. 3 and FIG. 5 as previously described.

The NOR gate 53 receives at one input node thereof the output of the NAND gate 51, and receives at the other input node thereof the test-enable signal TE. When at least one of the output of the NAND gate 51 and the test-enable signal TE is HIGH, the output of the NOR gate 53 is set to LOW. This output of the NOR gate 53 is supplied as the store-enable signal STE to the level shifter 42 and the plate line drive circuit 43 via the inverter 44 as shown in FIG. 2. The waveform of the store-enable signal STE is shown in FIG. 3 through FIG. 5 as previously described.

Figure 7:
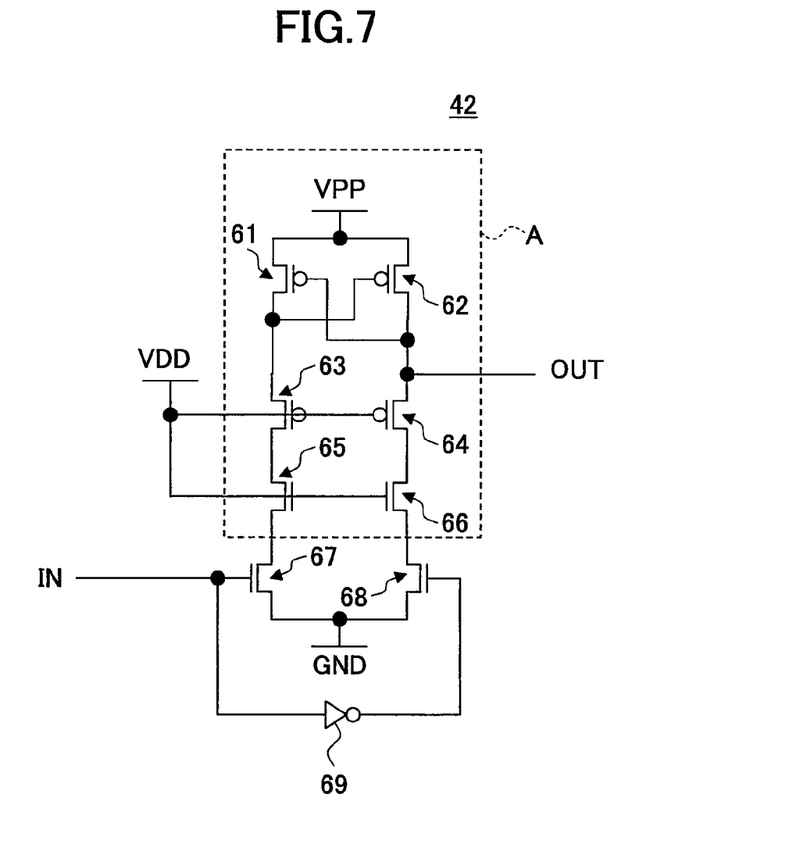
FIG. 7 is a drawing showing an example of the circuit configuration of a level shifter shown in FIG. 2.

FIG. 7 is a drawing showing an example of the circuit configuration of the level shifter 42 shown in FIG. 2. The level shifter 42 includes PMOS transistors 61 through 64, NMOS transistors 65 through 68, and an inverter 69. An input signal IN changes within a range of 0 V to 1.8 V, for example. The level shifter 42 shifts the signal level of the input signal IN so as to produce an output signal OUT varying within a range of VDD+Vthp to VPP, for example. Here, Vthp is the threshold voltage of PMOS transistors 63 and 64.

When the input signal IN is HIGH (i.e., 1.8 V), the NMOS transistors 67 and 68 become conductive and nonconductive, respectively, so that the NMOS transistors 65 and 66 are made conductive and nonconductive, respectively. Since the NMOS transistors 65 and 67 are conductive, the PMOS transistor 63 becomes weakly conductive when the source node of the PMOS transistor 63 is set to VDD+Vth. While the source node of the PMOS transistor 63 stays at VDD+Vth, the source node of the PMOS transistor 64 reaches VPP, thereby turning off the PMOS transistor 61. The output signal OUT is set to VPP in the end.

When the input signal IN is LOW (i.e., 0 V), the NMOS transistors 67 and 68 become nonconductive and conductive, respectively, so that the NMOS transistors 65 and 66 are made nonconductive and conductive, respectively. Since the NMOS transistors 66 and 68 are conductive, the PMOS transistor 64 becomes weakly conductive when the source node of the PMOS transistor 64 is set to VDD+Vth. While the source node of the PMOS transistor 64 stays at VDD+Vth, the source node of the PMOS transistor 63 reaches VPP, thereby turning off the PMOS transistor 62. The output signal OUT is set to VDD+Vth in the end.

The output signal OUT varying in a range of VDD+Vth to VPP is applied to the gate node of the PMOS transistor 45 shown in FIG. 2. In FIG. 2, when the store-enable signal STE is HIGH, the output of the level shifter 42 is set to VDD+Vth, so that the PMOS transistor 45 is turned on. A PMOS transistor 46 also becomes conductive in this case while the NMOS transistor 48 is turned off. The plate line PL is thus set to VPP. When the store-enable signal STE is LOW, the output of the level shifter 42 is set to VPP, so that the PMOS transistor 45 is turned off. Since the NMOS transistor 48 is made conductive in this case, the plate line PL is set to 0V.

In the level shifter 42 shown in FIG. 7, all the NMOS transistors and PMOS transistors situated inside a dotted-line frame A are designed to have a 3.3-V breakdown voltage. Further, all the PMOS transistors 45 and 46 and the NMOS transistors 47 and 48 are designed to have a 3.3-V breakdown voltage. The use of high-breakdown voltage transistors ensures a proper circuit operation without undesirable change in the characteristics of these transistors.

Figure 8:
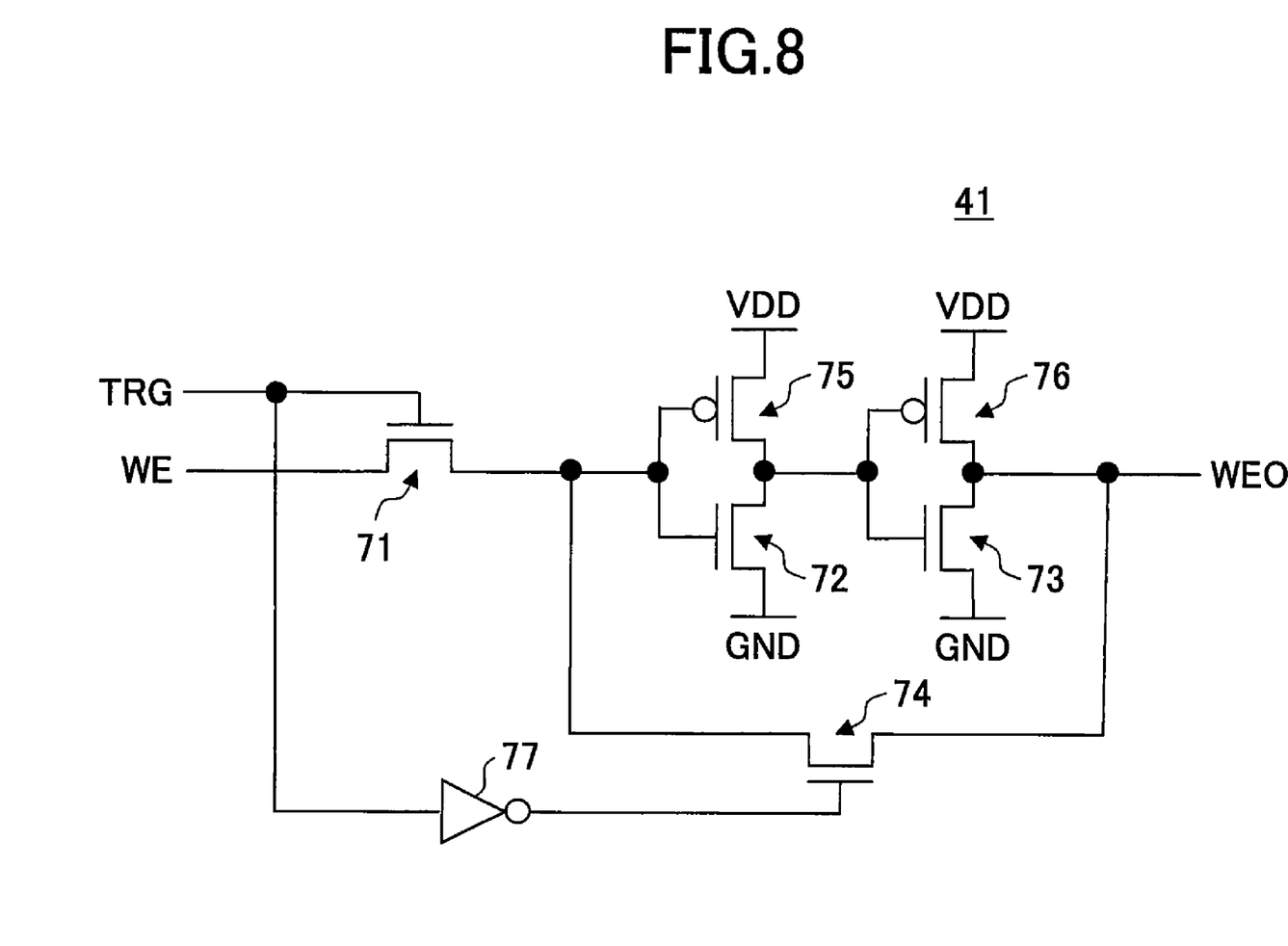
FIG. 8 is a drawing showing an example of the circuit configuration of a D-latch shown in FIG. 2.

FIG. 8 is a drawing showing an example of the circuit configuration of the D-latch 41 shown in FIG. 2. The D-latch 41 includes a NMOS transistors 71 through 74, PMOS transistors 75 and 76, and an inverter 77. The NMOS transistor 72 and the PMOS transistor 75 together form a first inverter, and the NMOS transistor 73 and the PMOS transistor 76 together form a second inverter. The output of the second inverter is coupled to the input of the first inverter via the NMOS transistor 74. The first inverter and the second inverter thus serve as a latch when the NMOS transistor 74 is conductive.

When the trigger signal TRG is HIGH, the NMOS transistor 71 is placed in a conductive state while the NMOS transistor 74 is placed in a nonconductive state. The write-enable signal WE is thus output as the signal WEO from the output node of the D-latch 41. The trigger signal TRG thereafter becomes LOW. In response, the NMOS transistor 71 is placed in a nonconductive state while the NMOS transistor 74 is placed in a conductive state. The latch comprised of the first inverter and the second inverter thus latches the write-enable signal WE, such that the signal WE continues to be output at the output node of the D-latch 41 even after the write-enable signal WE is changed. This signal WE output from the D-latch 41 is used in the mechanism that controls a logic level inversion as previously described.

The embodiments described above have been directed to an example in which a 0.18-μm process technology is used, and the high voltage VPP is set to 5 V. This is not a limiting example. A 3.3-μm process technology may alternatively be used with the high voltage VPP set to 6.5 V, for example.

Further, the present invention is not limited to these embodiments, but various variations and modifications may be made without departing from the scope of the present invention.

What is claimed is:

1. A nonvolatile semiconductor memory device, comprising:
   a plate line;
   a latch circuit including a first inverter and a second inverter cross-coupled to each other, the first inverter including a first MIS transistor of a first conduction type and a second MIS transistor of a second conduction type connected in series, the second inverter including a third MIS transistor of the first conduction type and a fourth MIS transistor of the second conduction type connected in series, a source node of the second MIS transistor and a source node of the fourth MIS transistor being both coupled to the plate line; and
   a control circuit configured to apply a first potential to the plate line in a store mode to cause a change in threshold voltage to one of the second MIS transistor and the fourth MIS transistor, whichever is selected in response to data latched in the latch circuit, and configured to apply a second potential to the plate line in a power-on mode to cause the latch circuit to latch data responsive to the change in threshold voltage generated in the store mode, such that the data latched by the latch circuit in the power-on mode is automatically output from an output terminal to outside the nonvolatile semiconductor memory device upon power-on thereof.

2. The nonvolatile semiconductor memory device as claimed in claim 1, wherein the first potential is set to such a level as to cause a hot-carrier effect to one of the second MIS transistor and the fourth MIS transistor, whichever is selected in response to data latched in the latch circuit.

3. The nonvolatile semiconductor memory device as claimed in claim 1, further comprising an inversion control circuit having an input node thereof coupled to the latch circuit and an output node thereof coupled to the output terminal, wherein the inversion control circuit is configured to produce at the output node thereof data inverse to data received at the input node in one of the store mode and the power-on mode, and is further configured to produce at the output node thereof data identical to data received at the input node in another one of the store mode and the power-on mode.

4. The nonvolatile semiconductor memory device as claimed in claim 3, wherein the inversion control circuit includes:
   a logic gate configured to output the data inverse to data received at the input node or the data identical to data received at the input node depending on a signal level of a control signal;
   a logic circuit configured to set the control signal to a first signal level in the store mode and to a second signal level in the power-on mode.

5. The nonvolatile semiconductor memory device as claimed in claim 4, wherein the logic circuit is a latch configured to latch a write-enable signal applied to the nonvolatile semiconductor memory device and to output the latched write-enable signal as the control signal.

6. The nonvolatile semiconductor memory device as claimed in claim 3, further comprising an input terminal configured to receive data applied from outside the nonvolatile semiconductor memory device and coupled to the latch circuit, wherein the inversion control circuit is configured to produce, at the output terminal, data identical to data received at the input terminal in both the store mode and the power-on mode.

7. The nonvolatile semiconductor memory device as claimed in claim 6, wherein the control circuit is configured to apply the second potential to the plate line in a test-write mode such that the latch circuit latches data applied to the input terminal from outside the nonvolatile semiconductor memory device, and the inversion control circuit is configured to produce, at the output terminal, data identical to the data applied to the input terminal.

8. The nonvolatile semiconductor memory device as claimed in claim 7, wherein the control circuit is configured not to apply the first potential to the plate line during the test-write mode such that no change in threshold voltage is created in any one of the second MIS transistor and the fourth MIS transistor.

9. The nonvolatile semiconductor memory device as claimed in claim 1, wherein the control circuit is configured to apply the second potential to the plate line at a first phase of the store mode to cause the latch circuit to latch data supplied from outside the nonvolatile semiconductor memory device, and is configured to apply the first potential to the plate line at a second phase of the store mode to cause a change in threshold voltage to one of the second MIS transistor and the fourth MIS transistor, whichever is selected in response to the supplied data latched in the latch circuit.

* * * * *